(12) United States Patent
Ishikawa et al.

(10) Patent No.: US 7,255,747 B2
(45) Date of Patent: Aug. 14, 2007

(54) COAT/DEVELOP MODULE WITH INDEPENDENT STATIONS

(75) Inventors: Tetsuya Ishikawa, Saratoga, CA (US); Rick Roberts, San Jose, CA (US)

(73) Assignee: Sokudo Co., Ltd., Kyoto (JP)

( * ) Notice: Subject to any disclaimer, the term of this patent is extended or adjusted under 35 U.S.C. 154(b) by 65 days.

(21) Appl. No.: 11/111,154

(22) Filed: Apr. 20, 2005

(65) Prior Publication Data

US 2006/0134340 A1   Jun. 22, 2006

Related U.S. Application Data

(60) Provisional application No. 60/639,109, filed on Dec. 22, 2004.

(51) Int. Cl.
   *B05B 3/00* (2006.01)
   *B05B 11/02* (2006.01)
   *B05B 15/04* (2006.01)
   *B05C 11/00* (2006.01)

(52) U.S. Cl. ................... 118/323; 118/52; 118/666; 118/326

(58) Field of Classification Search .......... 118/52, 118/612, 323, 319, 320, 313, 666, 326, DIG. 7, 118/50; 134/198, 153; 396/611, 627; 427/421.1
See application file for complete search history.

(56) References Cited

U.S. PATENT DOCUMENTS 5,250,114 A   10/1993 Konishi et al.
5,960,225 A   9/1999 Fujimoto
6,258,167 B1   7/2001 Kawano et al.
6,616,762 B2   9/2003 Inada et al.
6,736,556 B2 *   5/2004 Kanagawa ................... 396/579
2006/0130747 A1 *   6/2006 Ishikawa et al. ............. 118/52

FOREIGN PATENT DOCUMENTS

JP   05003151 A   *   1/1993

OTHER PUBLICATIONS

English Translated Abstract of JP 05003151A.*
English Translated Abstract and Drawing KR2004013965A.*

* cited by examiner

*Primary Examiner*—Yewebdar Tadesse
(74) *Attorney, Agent, or Firm*—Townsend and Townsend and Crew LLP

(57) ABSTRACT

An apparatus for dispensing fluid during semiconductor substrate processing operations. The apparatus includes a first processing chamber, a second processing chamber, and a dispense arm assembly. The apparatus further includes a dispense arm access shutter positioned between the first and second processing chambers and moveable between an open and a closed position. The dispense arm assembly can travel from the first processing chamber to the second processing chamber when the dispense arm assembly is in the open position. In an alternative embodiment, the apparatus also includes a central fluid dispense bank between the first and second processing chambers and a second dispense arm access shutter positioned between the first and second processing chambers, wherein the dispense arm access shutter is positioned between the first processing chamber and the central fluid dispense bank and the second dispense arm access shutter is positioned between the central fluid dispense bank and the second processing chamber.

13 Claims, 11 Drawing Sheets

COAT/DEVELOP MODULE WITH INDEPENDENT STATIONS

CROSS-REFERENCES TO RELATED APPLICATIONS

This application claims the benefit of U.S. Provisional Application Ser. No. 60/639,109, filed Dec. 22, 2004, entitled "Twin Architecture For Processing A Substrate," which is incorporated herein by reference.

The following two regular U.S. patent applications (including this one) are being filed concurrently, and the entire disclosure of the other application is incorporated by reference into this application for all purposes.

Application Ser. No. 11/111,353, filed Apr. 20, 2005, entitled "Coat/Develop Module with Shared Dispense";

Application Ser. No. 11/111,154, filed Apr. 20 2005, entitled "Coat/Develop Module with Independent Stations".

BACKGROUND OF THE INVENTION

The present invention relates generally to the field of semiconductor processing equipment. More particularly, the present invention relates to a method and apparatus for dispensing fluids onto a semiconductor substrate. Merely by way of example, the method and apparatus has been applied to two processing chambers in a coat/develop module including at least one dispense arm access shutter. But it would be recognized that the invention has a much broader range of applicability.

Portions of the process of forming electronic devices are commonly performed in a multi-chamber processing system (e.g., a cluster tool) that has the capability to sequentially process substrates, (e.g., semiconductor wafers) in a controlled processing environment. A typical cluster tool used to deposit (i.e., coat) and develop a photoresist material, commonly known as a track lithography tool, will include a mainframe that houses multiple substrate transfer robots which transport substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

Two types of processing chamber generally included in a track lithography tool are substrate coating modules and substrate developing modules, sometimes collectively referred to as a coat/develop module. Typically, in a coat module, a spin coating process is used to form a layer of photoresist or other coating on an upper surface of a substrate. One method mounts a substrate on a spin chuck, which is rotated at up to several thousand revolutions per minute (RPMs). Several milliliters of a liquid (e.g., photoresist) is applied to a central region of the substrate and the spinning action of the spin chuck disperses the liquid over the surface of the substrate. The coating is processed in subsequent steps to form features on the substrate as is well known to one of skill in the art. In develop modules, a developer is applied to the surface of the substrate after exposure of the photoresist. The coat/develop modules contain a number of similarities, as well as differences, including different nozzle designs corresponding to varying viscosities of dispense fluids, among other factors.

In some previously known coat/develop modules, a single spin bowl is attached to a system for dispensing photoresist or other coating liquids. In some photoresist coating applications, it is desirable to provide a number of different coatings, including different thicknesses and materials. Particularly, the industry transition to 300 mm substrates has led to an increase in the number of different coating liquids. Accordingly, in some coat/develop modules, and particularly in photoresist coat modules, the dispense system may include a number of different dispense nozzles dispensing different photoresists. Additionally, a number of other dispense nozzles may be included that provide photoresists with varying concentrations of solutions and solvents.

In some coat/develop modules, the dispense nozzles are fabricated to precise tolerances in accordance with the tolerances associated with a particular semiconductor process. As a result of the number and quality of the dispense nozzles in some of these modules, the cost of the dispense system may be much larger than the cost of the spin bowl.

In general, coat/develop applications rotate the substrate to achieve a predetermined rotation speed, dispense the coating fluid, and then continue rotating the substrate for a predetermined period after the dispense step is completed. As described above, the rotation of the substrate is utilized to disperse the coating fluid over the surface of the substrate. In these processes, the dispense system is inactive while the substrate rotation dispenses the resist. Therefore, in some dispense systems, the most expensive system components, namely those included in the dispense apparatus, are idle during a significant fraction of the processing time.

Other previously known coat modules employ multiple spin bowls. One example of a coating apparatus with two spin chucks located in a single casing is described in U.S. Pat. No. 5,250,114. Wafers are loaded and unloaded from the spin chucks by a single robot located outside the casing. A single resist nozzle for dispensing a resist liquid is attached to a nozzle arm attached to an endless belt surrounding two rollers. The endless belt is driven by a motor. Through use of the motor and endless belt, the nozzle arm is able to serve both spin chucks.

The system as illustrated in U.S. Pat. No. 5,205,114 suffers from several problems. First, the system provides only a single resist nozzle that dispenses a single resist. Thus, the system does not provide a number of different coatings, including coatings of different materials. Second, the only isolation provided between the spin chucks and the other items contained inside the casing is a cup surrounding each spin chuck. The cup is raised into position during coating. Although this cup design may provide some containment for liquid particles scattered from the wafer surface, control of the atmosphere in the vicinity of the wafers is not provided by this design. As a result, air-borne particles and solvent mist are free to move from one spin chuck to the other or from a waiting trench where the single nozzle waits to either of the wafers.

Therefore, a need exists in the art for improved coat/develop modules and improved methods of operating the same.

SUMMARY OF THE INVENTION

According to the present invention, techniques related to the field of semiconductor processing equipment are provided. More particularly, the present invention includes a method and apparatus for dispensing fluids onto a semiconductor substrate. Merely by way of example, the method and apparatus has been applied to two processing chambers in a coat/develop module including at least one dispense arm access shutter. But it would be recognized that the invention has a much broader range of applicability.

In a specific embodiment of the present invention, an apparatus for dispensing fluid during semiconductor substrate processing operations is provided. The apparatus includes a first processing chamber, a second processing chamber, and a dispense arm assembly. The apparatus also includes a dispense arm access shutter positioned between the first and second processing chambers and moveable between an open and a closed position, wherein the dispense arm assembly can travel from the first processing chamber to the second processing chamber when the dispense arm access shutter is in the open position.

In another embodiment of the present invention, a method of dispensing a fluid onto a semiconductor substrate using an apparatus comprising a dispense nozzle, a first processing chamber, a second processing chamber, and a dispense arm access shutter positioned between the first and second processing chambers is provided. The method includes opening the dispense arm access shutter, moving the dispense nozzle to a first position in the first processing chamber, and dispensing a fluid from the dispense nozzle. The method further includes moving the dispense nozzle to a second position between the first and second processing chamber and closing the dispense arm access shutter.

In another specific embodiment of the present invention, a track lithography tool is provided. The track lithography tool includes a front end module adapted to receive FOUPs containing a plurality of substrates, a central module comprising a plurality of processing tools, and a rear module coupled to a scanner. The track lithography tool also includes at least one robot adapted to receive a substrate from the front end module and deliver the substrate to either a processing tool and/or the rear module, wherein one of the plurality of processing tools is an apparatus for dispensing fluid during semiconductor substrate processing operations. The apparatus includes a first processing chamber, a second processing chamber, a dispense arm assembly, and a dispense arm access shutter positioned between the first and second processing chambers and moveable between an open and a closed position, wherein the dispense arm assembly can travel from the first processing chamber to the second processing chamber when the dispense arm assembly is in the open position.

Many benefits are achieved by way of the present invention over conventional techniques. For example, the present technique allows for sharing of some common components, reducing system cost, complexity, and footprint. Moreover, embodiments of the present invention provide for increased system reliability while reducing the number of redundant systems provided for each processing chamber. These and other benefits will be described in more detail throughout the present specification and more particularly below.

These and other embodiments of the invention along with many of its advantages and features are described in more detail in conjunction with the text below and attached figures.

DESCRIPTION OF SPECIFIC EMBODIMENTS

According to the present invention, techniques related to the field of semiconductor processing equipment are provided. More particularly, the present invention includes a method and apparatus for dispensing fluids onto a semiconductor substrate. Merely by way of example, the method and apparatus has been applied to two processing chambers in a coat/develop module including at least one dispense arm access shutter. But it would be recognized that the invention has a much broader range of applicability.

Figure 7:
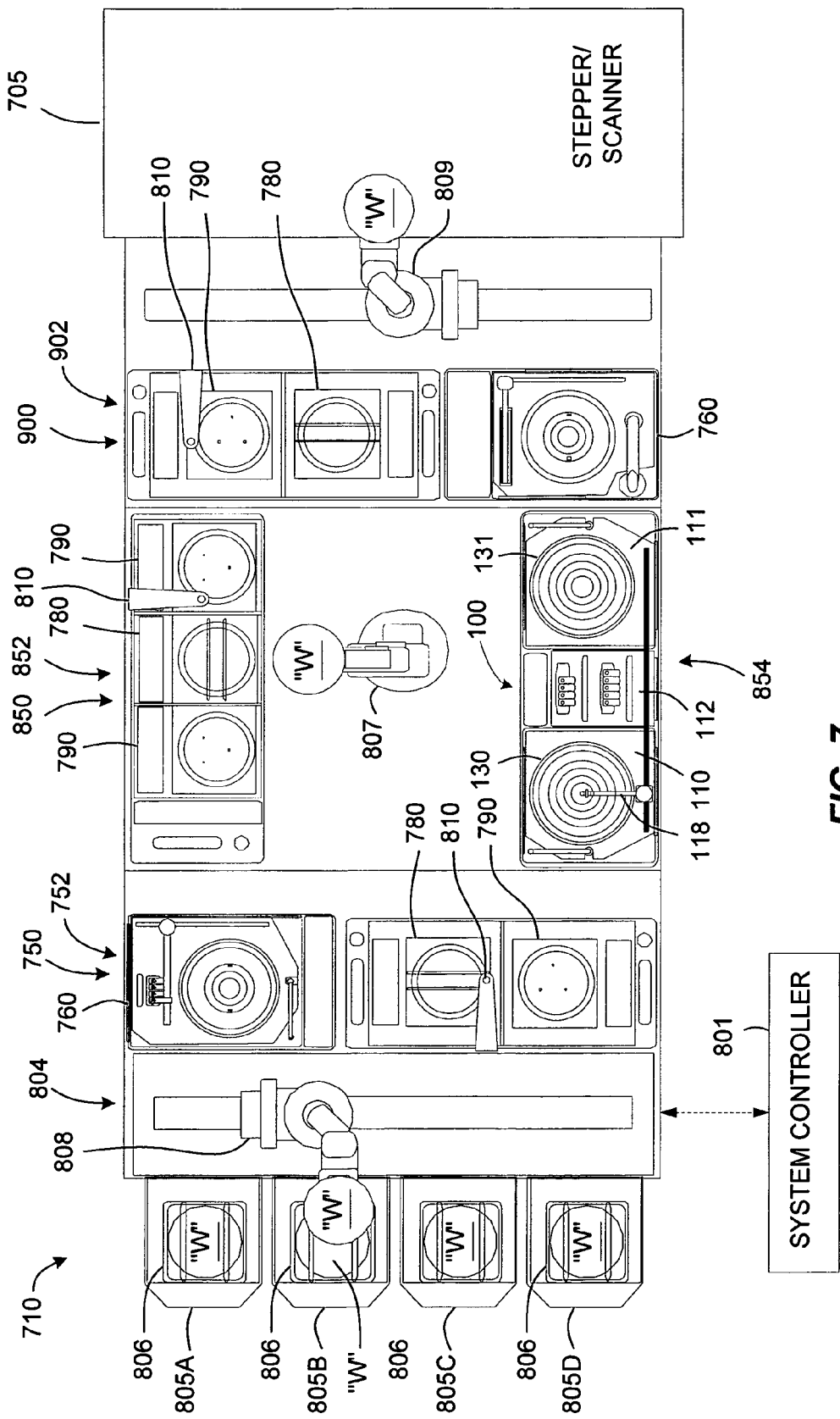
FIG. 7 is a plan view of one embodiment of a track lithography tool that illustrates a number of the aspects of the present invention.

FIG. 7 is a plan view of one embodiment of a track lithography tool 710 that illustrates a number of the aspects of the present invention that may be used to advantage. One embodiment of the track lithography 710, as illustrated in FIG. 7, contains a front end module (sometimes referred to as a factory interface) 750, a central module 850, and a rear module (sometimes referred to as a scanner interface) 900. The front end module 750 generally contains one or more pod assemblies or FOUPS 805 (e.g., items 805A-D), a front end robot 808, and a front end processing rack 752. The central module 850 will generally contain a first central processing rack 852, a second central processing rack 854, and a central robot 807. The rear module 900 will generally contain a rear processing rack 902 and a back end robot 809. In one embodiment, the track lithography tool 710 contains: a front end robot 808 adapted to access processing modules in the front end processing rack 752; a central robot 807 that is adapted to access processing modules in the front end processing rack 752, the first central processing rack 852, the second central processing rack 854 and/or the rear processing rack 902; and a back end robot 809 that is adapted to access processing modules in the rear processing rack 902 and in some cases exchange substrates with a stepper/scanner 705. In one embodiment, a shuttle robot 810 is adapted to transfer substrates between two or more adjacent processing modules retained in one or more processing racks (e.g., front end processing rack 752, first central processing rack 852, etc.). In one embodiment, a front end enclosure 804 is used to control the environment around the front end robot 808 and between the pods assemblies 805 and front end processing rack 752.

FIG. 7 also contains more detail of possible process chamber configurations found in aspects of the invention. For example, the front end module 750 generally contains one or more pod assemblies or FOUPs 805, a front end robot 808 and a front end processing rack 752. The one or more pod assemblies 805, are generally adapted to accept one or more cassettes 806 that may contain one or more substrates "W", or wafers, that are to be processed in the track lithography tool 710. The front end processing rack 752 contains multiple processing modules (e.g., bake plate 790, chill plate 780, etc.) that are adapted to perform the various processing steps found in the substrate processing sequence. In one embodiment, the front end robot 808 is adapted to transfer substrates between a cassette mounted in a pod assembly 805 and between the one or more processing modules retained in the front end processing rack 752.

The central module 850 generally contains a central robot 807, a first central processing rack 852 and a second central processing rack 854. The first central processing rack 852 and a second central processing rack 854 contain various processing modules (e.g., coater/developer module 100, bake module 790, chill plate 780, etc.) that are adapted to perform the various processing steps found in the substrate processing sequence. In one embodiment, the central robot 807 is adapted to transfer substrates between the front end processing rack 752, the first central processing rack 852, the second central processing rack 854 and/or the rear processing rack 902. In one aspect, the central robot 807 is positioned in a central location between the first central processing rack 852 and a second central processing rack 854 of the central module 850.

The rear module 900 generally contains a rear robot 809 and a rear processing rack 902. The rear processing rack 902 generally contains processing modules (e.g., coater/developer module 760, bake module 790, chill plate 780, etc.) that are adapted to perform the various processing steps found in the substrate processing sequence. In one embodiment, the rear robot 809 is adapted to transfer substrates between the rear processing rack 900 and a stepper/scanner 705. The stepper/scanner 705, which may be purchased from Canon USA, Inc. of San Jose, Calif., Nikon Precision Inc. of Belmont, Calif., or ASML US, Inc. of Tempe Ariz., is a lithographic projection apparatus used, for example, in the manufacture of integrated circuits (ICs). The scanner/stepper tool 705 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

In one embodiment, a controller 801 is used to control all of the components and processes performed in the cluster tool 710. The controller 801, is generally adapted to communicate with the stepper/scanner 705, monitor and control aspects of the processes performed in the cluster tool 810, and is adapted to control all aspects of the complete substrate processing sequence. The controller 801, which is typically a microprocessor-based controller, is configured to receive inputs from a user and/or various sensors in one of the processing chambers and appropriately control the processing chamber components in accordance with the various inputs and software instructions retained in the controller's memory. The controller 801 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 801 determines which tasks are performable in the processing chamber(s). Preferably, the program is software readable by the controller 801 and includes instructions to monitor and control the process based on defined rules and input data.

FIG. 7 further illustrates a coater/developer module 100 mounted in the second central processing rack 854, that may adapted to perform a photoresist coat step or a develop step in both of the processing chambers 110 and 111. This configuration is advantageous since it allows some of the common components found in the two processing chambers 110 and 111 to be shared thus reducing the system cost, complexity and footprint of the tool. As illustrated in FIG. 7 and described in more detail below, two spin chucks 130 and 131 are provided in processing chambers 110 and 111, respectively. A shared central fluid dispense bank 112 is positioned between the two processing chambers and dispense arm assembly 118 is able to select nozzles from the central fluid dispense bank and serve both spin chucks. In embodiments of the present invention, central robot 807 is able to access both processing chambers 110 and 111 independently.

Figure 1A:
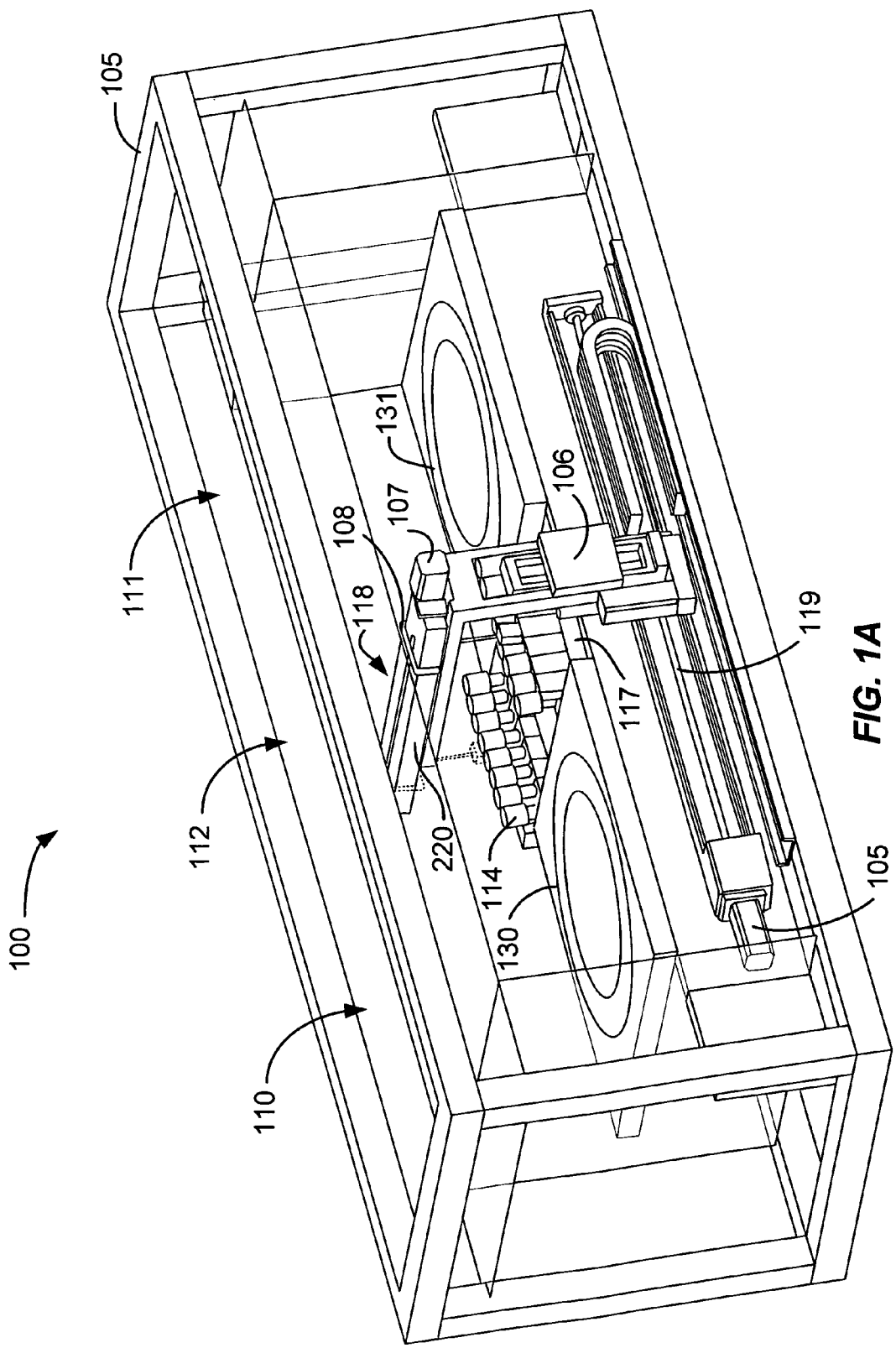
FIG. 1A is a simplified perspective illustration of a fluid dispensing apparatus according to one embodiment of the present invention.

FIG. 1A is a simplified perspective illustration of a fluid dispensing apparatus according to one embodiment of the present invention. Fluid dispensing apparatus 100 is illustrated as containing a frame 105. Additional components are provided by embodiments of the present invention, although, for purposes of clarity, not all components are illustrated. For example, intake and exhaust ports, as well as electrical feeds generally present at the sides of the frame are not illustrated in FIG. 1A. Additional details concerning some of the components are provided in FIG. 2.

As illustrated in FIG. 1A, two separate processing chambers 110 and 111 are located within frame 105 on the left and right sides of a central fluid dispense bank 112, respectively. In some coat/develop modules, processing chambers 110 and 111 are referred to as processing stations. Herein the terms processing chamber and processing station is used interchangeably. Merely by way of example, the invention has been applied to a coater/developer module with a pair of coat/develop bowls horizontally arrayed on either side of a central fluid dispense bank, but this is not required by the present invention. In a particular embodiment, the coat module is a photoresist module with different photoresists as well as photoresists combined with different concentrations of solvents. As will be evident to one of skill in the art, the fluids dispensed by the central fluid dispense bank may be delivered in the form of liquid, vapor, mist, or droplets.

In other embodiments, the processing chambers are processing modules that may be adapted to perform, for example, coating processes using organic and inorganic fluids, hybrid organic/inorganic fluids, aqueous fluids, and the like. Merely by way of example, these fluids may be utilized in processes including bottom antireflection coating (BARC), resist, top antireflection coating (TARC), develop, shrink coat, PIQ™ (Poly-Isoindolo-Quinazolinedione), spin on materials including spin on glass, spin on dielectric, spin on hardmask, and the like. Moreover, processes utilizing other fluids, including those used for electroless and electrochemical plating processes, as well as wet clean and the like, are included in the scope of the present invention.

In the embodiment illustrated in FIG. 1A, the processing chambers 110 and 111 generally contain all of the processing components described in U.S. Provisional Application Ser. No. 60/639,109 in conjunction with the coater module or developer module. Additionally, the two chambers share central fluid dispense bank 112. The central fluid dispense bank contains a number of dispense nozzles 114. Each spin chuck 130 and 131 is coupled to a motor (not shown) through a shaft (not shown) and adapted to rotate about an axis perpendicular to the face of the spin chuck. In some embodiments, the spin chucks 130 and 131 contain a sealing surface connected to a vacuum source that is adapted to hold the substrate while the substrate is being rotated.

A controller (not shown) is provided and connected to the motors so that the timing and rotation speed of the spin chucks can be controlled in a predetermined manner. In some embodiments, the rotation speed may be variable or constant as a function of time. In one embodiment, the rotation motor is adapted to rotate a 300 mm semiconductor substrate between about 1 revolution per minute (RPM) and about 5,000 RPMs with an acceleration rate of up to about 50,000 RPMs/s. One of ordinary skill in the art would recognize many variations, modifications, and alternatives.

The dispense arm assembly 118 is actuated in three dimensions by motors 105, 106, and 107. Motor 105 is used to move the dispense arm assembly along the guide rail 119 in a first direction, sometimes referred to as a longitudinal direction. The motor is selected to provide for motion of the dispense arm assembly with predetermined speed, accuracy, and repeatability. In one embodiment, the travel of the dispense arm assembly along the guide rail is sufficient for the dispense arm assembly to reach the center of both wafers. In some embodiments, motion stops, positional feedback, and interlocks are provided as are well known to one of skill in the art.

Motor 106 is used to move extension arm 117 in a second (vertical) direction, sometimes referred to as a transverse direction. The motor is selected to provide for motion of the extension arm with predetermined speed, accuracy, and repeatability. In one embodiment, the travel of the extension arm in the transverse direction is sufficient for a gripper assembly to reach the dispense nozzles, and to lift the dispense nozzles above upper edges of the cups, extension arm access doors, and other obstructions while moving to the center of the spin chuck. In some embodiments, motion stops, positional feedback, and interlocks are provided as are well known to one of skill in the art.

Motor 107 is used to move the gripper assembly 108 in a third direction, sometimes referred to as a lateral direction. As illustrated in FIG. 1A, the gripper assembly 107 is moveable along the extension arm 220 and is shown in a first position above nozzle holder assembly 117 and in a second optional position above nozzle holder assembly 116. The motor is selected to provide for motion of the gripper assembly with predetermined speed, accuracy, and repeatability. In one embodiment, the travel of the gripper assembly in the lateral direction is sufficient for the gripper assembly to reach both nozzle banks. In embodiments in which a single nozzle bank oriented in the transverse direction is utilized, the travel of the gripper assembly is sufficient for the gripper assembly to reach all nozzles in the bank. In some embodiments, motion stops, positional feedback, and interlocks are provided as are well known to one of skill in the art.

Figure 1B:
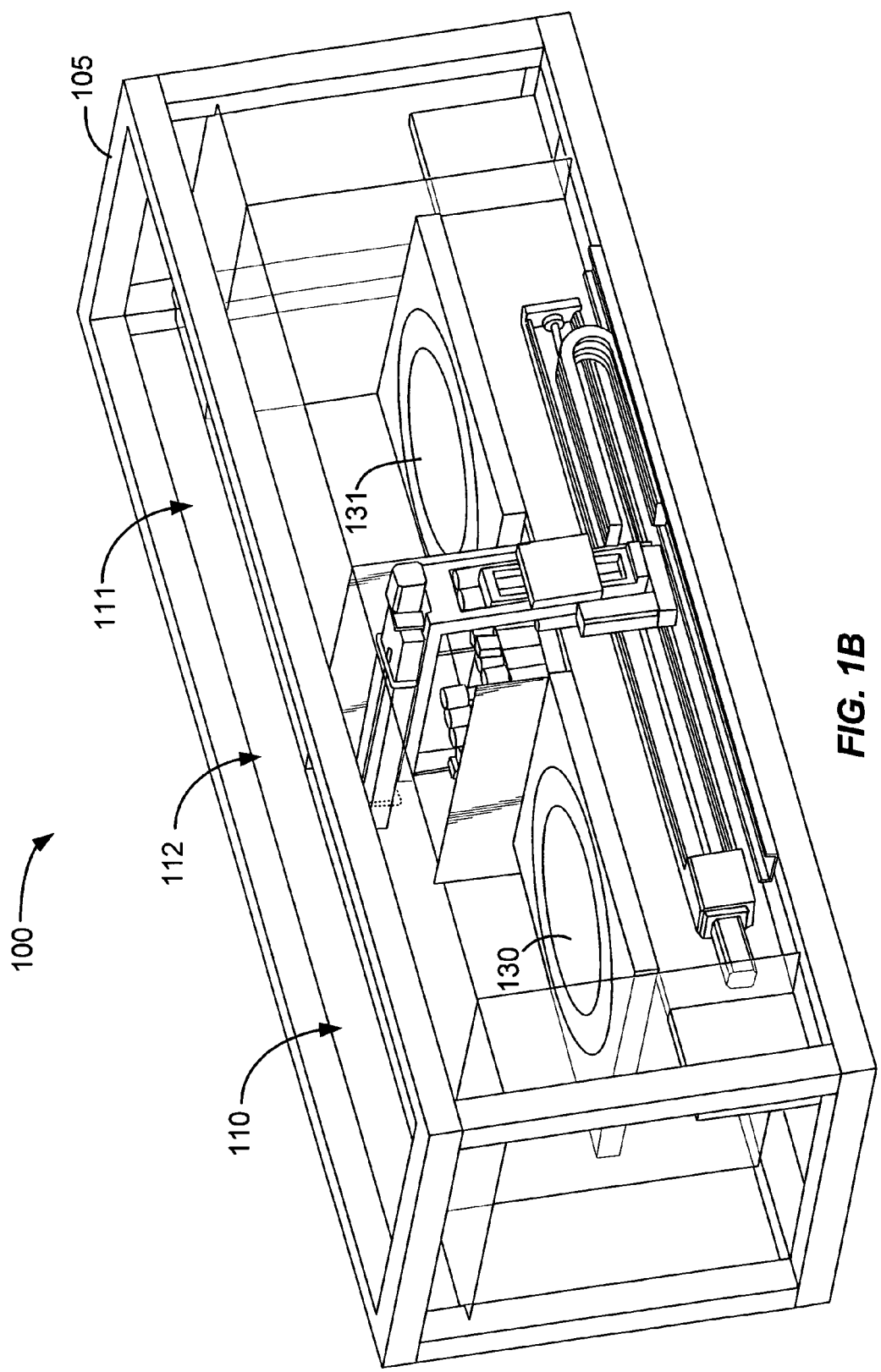
FIG. 1B is a simplified perspective illustration of a fluid dispensing apparatus according to another embodiment of the present invention.

FIG. 1B is a simplified perspective illustration of a fluid dispensing apparatus according to another embodiment of the present invention. As illustrated in FIG. 1B, dispense arm access shutters 122 and 123 are provided inside the frame 105. Dispense access arm shutter 122 is positioned between the first processing chamber 110 and the central fluid dispense bank 112. Dispense access arm shutter 123 is positioned between the central fluid dispense bank and the second processing chamber 111. In embodiments of the present invention, the dispense arm access shutters are moveable between an open and closed positioned, along with positioned therebetween. As illustrated in FIG. 1B, dispense arm access shutter 122 is about half way between the open and closed position. Dispense arm access shutter 123 is illustrated in a closed position. When the dispense arm access shutters are in the open position, the dispense arm assembly is free to travel between the processing chambers and the central fluid dispense bank.

Figure 2:
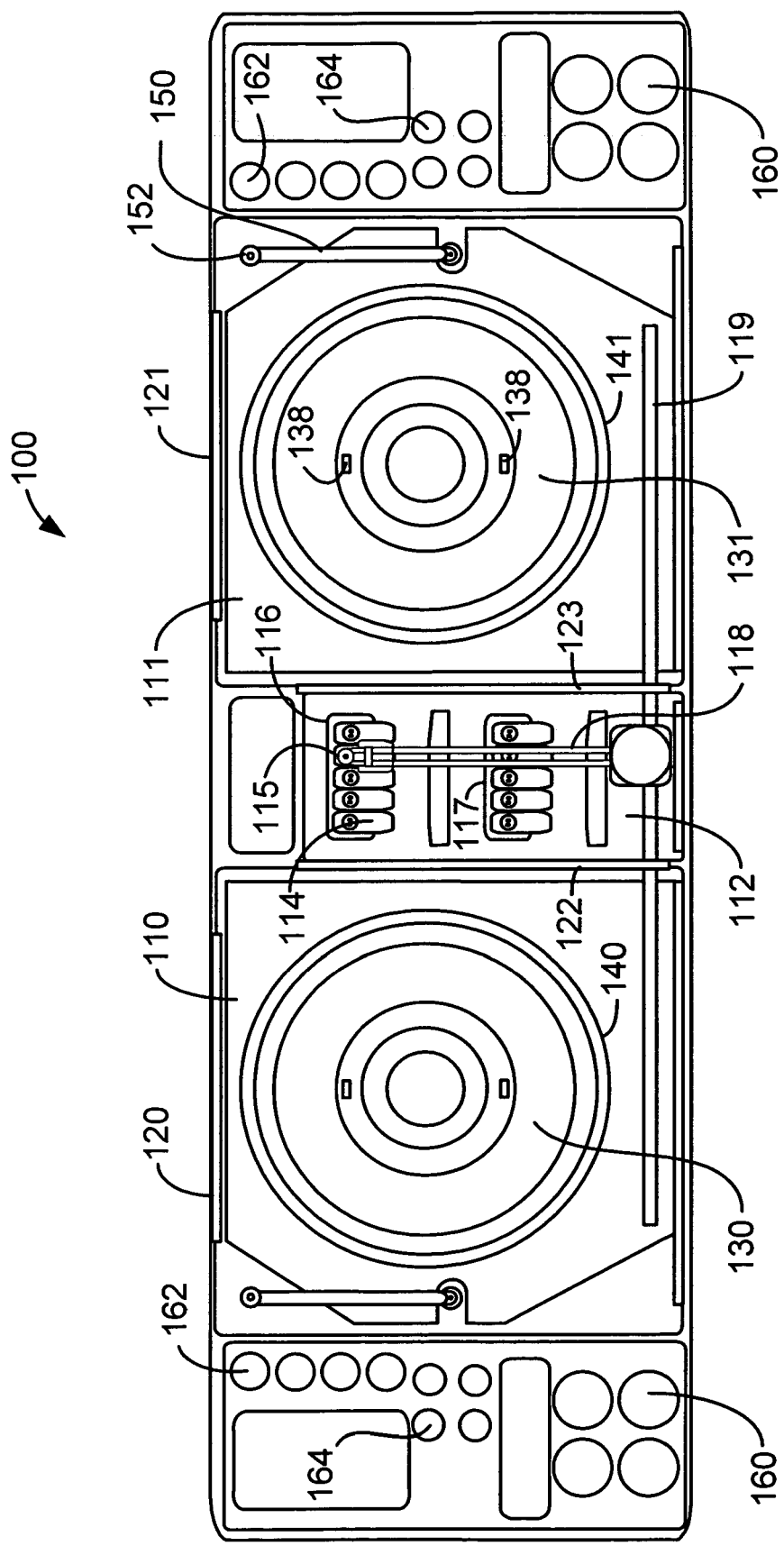
FIG. 2 is a simplified schematic plan view of a fluid dispensing apparatus according to one embodiment of the present invention.

FIG. 2 is a simplified schematic plan view of a fluid dispensing apparatus according to one embodiment of the present invention. Referring to FIG. 2, the cups 140 and 141 are manufactured from a material characterized by suitable rigidity and solvent-resistance. For example in some embodiments of the present invention, cups 140 and 141 are manufactured from a plastic material (e.g., Polytetrafluoroethylene (PTFE), perfluoroalkoxy (PFA) , polypropylene, or Polyvinylidene fluoride (PVDF)), a ceramic material, a metal coated with a plastic material (e.g., aluminum or SST coated with either PVDF, Halar, etc.), or other materials that are compatible with the processing fluids delivered from the fluid dispense system 112.

A lift assembly (not shown) generally contains an actuator (not shown), such as an air cylinder or servomotor, and a guide (not shown), such as a linear ball bearing slide, which are adapted to raise and lower the rotatable spin chucks 130 and 131 to a desired position. The lift assembly is thus adapted to position the substrate mounted on the rotatable spin chucks in the cups during processing and also lift the substrate above the top of the cup to exchange the substrate with an external robot positioned outside the enclosure 100. A robot blade (not shown), which is attached to the external robot, enters the apparatus 100 through the robot access shutters 120 and 121.

As illustrated in FIG. 2, a pre-wet nozzle 115 is located at a distal end of extension arm assembly 118. In some embodiments, the pre-wet nozzle is plumbed through components coupled to the extension arm. In these embodiments, because the single pre-wet nozzle is present on the extension arm, the design of each of the individual dispense nozzles is simplified. In particular, in some embodiments, no pre-wet nozzle is included as part of each dispense nozzle. As described more fully below, the extension arm is a telescoping arm, thus capable of controllably positioning the pre-wet nozzle 115 a desired distance from the guide mechanism 119. Furthermore, backside rinse (BSR) nozzles 138 are included on a portion of the bowl situated below a substrate positioned on the spin chucks 130 and 131. The BSR nozzles provide a solvent applied to the backside of the substrate during a cleaning step. In one embodiment, an edge bead removal (EBR) arm 150 is provided at a corner of each processing chamber. As illustrate in FIG. 2, the EBR arm rotates around a pivot 152 located at a proximal end of the EBR arm to position a distal end of the EBR arm at a position over an edge of a substrate mounted on the spin chuck. An EBR fluid is dispensed through a nozzle located at the distal end of the EBR arm to remove an edge bead present on the substrate.

A gas flow distribution system is adapted to deliver a uniform flow of a gas through the enclosure 100 and processing chambers 110 and 111. In a specific embodiment the gas flow distribution system provides temperature and/or humidity controlled air through supply ports 160. Cup exhausts 162 provide for removal of air from the processing chamber. Cup drains 164 provide for removal of fluids from the cups. As illustrated in FIG. 2, four ports are shown in relation to the temperature and/or humidity controlled air, the cup exhausts, and the cup drains. This illustration is provided because, in some embodiments, four dispense systems are vertically stacked to reduce system footprint. Thus, for example, each of the illustrated cup exhausts is coupled to a cup in one of the four dispense systems.

Although the various air and fluid handling components shown in FIG. 2 are illustrated as four separate ports, this is not required by the present invention. In alternative embodiments, the air and fluid handling components are provided in different numbers depending on the overall system architecture. Additionally, although the ports are illustrated as uniform in dimension within each group, this is not required by the present invention. Moreover, combination of separate ports into larger communal ports are provided in alternative embodiments. One of ordinary skill in the art would recognize many variations, modifications, and alternatives.

Moreover, as will be evident to one of skill in the art, provision of temperature and humidity controlled gas, for example, air, to the processing chambers generally extends to the monitoring and control of various air flow parameters. Merely by way of example, in an embodiment of the present invention, the environment of the chamber is monitored and parameters including the solvent partial pressure and vapor concentration, air flow velocity, air flow rates, and differential pressure among others, are controlled to achieve the desired air temperature and humidity. Moreover, static discharge from the film present on the substrate is controlled in some embodiments in addition to the chamber environment. Accordingly, through control of the processing chamber environment and substrate parameters, among other factors, such as chuck spin rate, it is possible to control the coating characteristics.

Each of the two chambers also includes a robot access shutter 120/121 to alternately provide a seal for an access port and provide access for a robot arm to pass through the access port. When a substrate is ready to be processed and the processing chamber is available to process the substrate, the robot access shutter is opened. A robot arm (not shown), on which the substrate is supported, is moved through the access port to move the substrate from a position outside the processing chamber to a position over one of the spin chucks. Utilizing methods well known to one of skill in the art, the robot arm places the substrate on the spin chuck, exits the processing chamber, and the robot access shutter is closed.

Using the robot access shutters 120 and 121, a robot can load substrates into processing chambers 110 and 111 independently in an alternating manner. In some embodiments, while coat/develop processes are performed in processing chamber 110, robot access shutter 121 is opened to load a substrate into processing chamber 111. Alternatively, while coat/develop processes are performed in processing chamber 111, robot access shutter 120 provides independent access to processing chamber 110. System throughput is enhanced using embodiments of the present invention as loading and processing of substrates is performed simultaneously in the two processing chambers.

As illustrated in FIG. 2, each of the two processing chambers also include a dispense arm access shutter 122 and 123 positioned between the spin chucks 130 and 131, respectively, and the central fluid dispense bank 112. Although dispense arm access shutters are not provided in the embodiment illustrated in FIG. 1, in some embodiments, the dispense arm access shutters provide a shield to isolate the processing chambers from the central fluid dispense bank during operation of the system. Generally, the dispense arm access shutter is opened to permit movement of a dispense arm assembly 118 into the processing chambers and closed after completion of the dispense step and return of the dispense arm assembly to the central fluid dispense bank region. In general, coat processes include accelerating the substrate to a desired spin rate, dispensing the coating fluid, e.g., resist, for several seconds, and continue spinning the substrate for tens of seconds. Merely by way of example, in one embodiment of the present invention, the substrate is spun up until a rate of 500 RPMs is reached, resist is dispensed for about 3 seconds, and the substrate is maintained at a spin rate of 1,800 RPMs for about 60 seconds. In this embodiment, after the resist fluid is dispensed, the dispense arm returns to the central fluid dispense bank and the dispense arm access shutter is closed while the substrate continues spinning for about 55 seconds.

In some embodiments of the present invention, the dispense arm access shutters 122 and 123 not only provide for isolation from liquids present in the central fluid dispense bank, but for additional particle control inside each of the processing chambers. For example, in one embodiment, the dispense arm access shutter provides a seal for the processing chamber that limits the flow of air-borne particles from the central fluid dispense bank into the processing chambers. Accordingly, the dispense arm access shutters minimize cross-talk between processing chambers and prevent contaminants from traveling across chamber boundaries. Additionally, the dispense arm access shutters provide for substantial flow restriction between processing chambers, reducing the air flow between the respective processing chambers and the central fluid dispense bank. Generally, to provide acceptable service lifetimes, among other reasons, the dispense arm access shutters are made from chemically resistant materials such as aluminum and the like.

Although illustrated in FIG. 1B as sliding vertically between the open and closed positions, this is not required by the present invention. In other embodiments, the dispense arm access shutters are moved between various positions in linear, rotary, angled trajectories, or the like. In some embodiments, the dispense arm access shutters are actuated by pneumatic pressure, a solenoid, or by a motor, depending on the particular application. Generally, the motion of the dispense arm access shutters is controlled in conjunction with one or more interlocks. In specific embodiments, the interlocks operate using mechanical, electrical, or software switches or controls. One of ordinary skill in the art would recognize many variations, modifications, and alternatives.

Moreover, independent control of the temperature and/or humidity in the vicinity of each of the substrates is provided by embodiments of the present invention. For some coating processes, the parameters associated with the finished coating are a function of the temperature of the coating process, the humidity in the vicinity of the substrate, or both.

Embodiments of the present invention provide for independent temperature and/or humidity control in processing chambers 110 and 111. Thus, for coating processes in which different temperature and/or humidity settings are needed for a particular process, embodiments of the present invention provide the necessary control. Merely by way of example, in processing chamber 110, a coating process may require control over the temperature and the humidity of the environment surrounding the substrate being coated, while simultaneously, a develop process may only require control of the temperature. In yet other embodiments, either the temperature, the humidity, or both may be independently controlled in the two processing chambers.

In some embodiments, the temperature and/or humidity inside a processing chamber may be controlled prior to, during, and after a dispense operation by the use of the robot arm access doors. For a process adapted to operate at a predetermined temperature and/or humidity, the access door can be opened to admit the dispense arm, partially closed during the fluid dispense step, fully re-opened to enable the dispense arm to exit the processing chamber, and fully closed during the completion of the dispense process.

The central fluid dispense bank 112 contains a plurality of nozzles 114 that are contained in one or more nozzle holder assemblies 116. As described more fully in U.S. Provisional Application Ser. No. 60/639,109, the fluid dispense system used in the coater or developer modules may contain one or more fluid source assemblies (not shown) which deliver one or more processing fluids to the surface of a substrate mounted on the spin chuck 130. In some embodiments of the present invention, the home position of the dispense arm is in the central fluid dispense bank region. Thus, during substrate loading and unloading operations through robot access doors 120 and 121, the dispense arm is located at the home position in the central fluid dispense bank region.

As illustrated in FIG. 1, two dispense nozzle banks are provided in one embodiment of the present invention. Each nozzle 114, contained in the nozzle holder assemblies 116, is typically connected to plumbing components (including a supply tube, a pump, a filter, a suck back valve, a fluid source, and the like) and is adapted to dispense a single type of processing fluid. In a particular embodiment, the processing fluid is a photoresist, a solvent, a coating, a developer, or the like. One of ordinary skill in the art would recognize many variations, modifications, and alternatives. As the dispense arm is able to be positioned in either the left or right processing chambers, each central fluid dispense bank can serve both processing chambers, thus reducing the redundancy required in each processing chamber.

As will be appreciated by one of skill in the art, the nozzle designs utilized for various processes typically differ depending on the features of the particular application. Merely by way of example, a resist nozzle bank typically includes between four and ten nozzles. In a particular embodiment of the present invention, a resist nozzle bank includes more than ten nozzles. Generally, resist nozzles are adapted to dispense a variety of chemicals, including resist, antireflection coatings, and spin on materials (e.g., SOG and SOD). A develop nozzle bank, on the other hand, typically includes between one and three nozzles. In some embodiments, more than three develop nozzles are included in a develop nozzle bank. Additionally, some develop nozzle banks include a number of rinse lines as appropriate to the particular application.

The design of the nozzle, whether resist or develop, may share similarities in design as appropriate to the particular applications. Moreover, the time over which dispense operations are performed will generally vary, with resist operations occurring over periods of several seconds, whereas develop operations may occur over periods of several hundred seconds. Accordingly, embodiments of the present invention provide central fluid dispense banks with nozzles appropriate to the function of the particular dispense assembly.

As illustrated in FIGS. 1 and 2, the central fluid dispense bank includes a number of dispense nozzles. In the embodiment illustrated in FIGS. 1A, 1B, and 2, the dispense nozzles are arranged in two groups of nozzles, specifically, a first group of five nozzles contained in nozzle holder assembly 116 and a second group of five nozzles contained in nozzle holder assembly 17. As illustrated, the dispense nozzles are arrayed longitudinally in the nozzle holder assemblies. In other words, the long dimension of the nozzle holder assemblies is aligned parallel to a line connecting the center of spin chuck 130 with the center of spin chuck 131. In embodiments in which the spin chucks are centered inside their respective processing chambers, the nozzle holder assemblies are aligned parallel to a line connecting the center of the first processing chamber and the second processing chamber. Another frame of reference to which the nozzle holder assemblies can be referenced is the length of the guide mechanism 119. As illustrated in FIG. 1, the nozzle holder assemblies 116 and 117 are aligned parallel to the length of the guide mechanism 119.

While FIGS. 1-3 illustrate a configuration where each nozzle holder assembly 116 contains five nozzles 114, in other embodiments the nozzle holder assembly 116 may contain a lesser number of nozzles or a greater number of nozzles without varying form the basic scope of the invention. For example, in one embodiment, two banks containing eight nozzles per bank are provided. Additionally, although the nozzle holder assemblies are illustrated as aligned parallel to the length guide mechanism 119 in FIG. 1, this is not required by the present invention. In alternative embodiments, the nozzle holder assemblies are aligned perpendicular to the length of the guide mechanism. Moreover, in one specific embodiment, a single bank containing eight nozzles is provided. In this specific embodiment, the single nozzle bank is arranged with nozzle holder assembly aligned perpendicular to the length of the guide mechanism. These alternative embodiments will be described below in more detail.

As illustrated in FIG. 1, all of the dispense nozzles provided in the nozzle dispense banks are arrayed in a single plane parallel to the plane including the spin chucks. However, this is not required by the present invention. In alternative embodiments (not illustrated), the dispense nozzles are stacked vertically, with a first number of nozzles arrayed in a first plane and a second number of nozzles are arrayed in a second plane. Moreover, in some embodiments, the nozzles are both stacked vertically and staggered laterally, providing access to the nozzles are appropriate to a particular application.

Figure 3A:
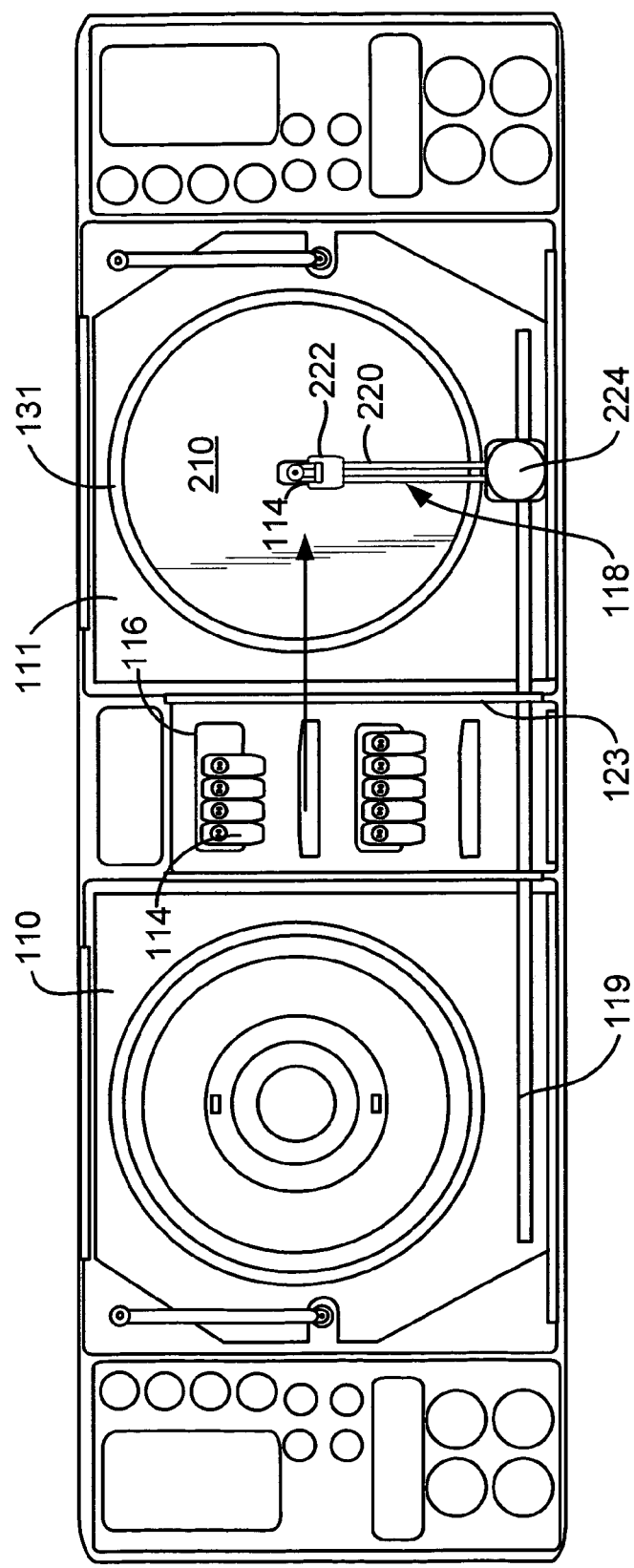
FIG. 3A is a simplified schematic plan view of a fluid dispensing apparatus in a first mode of operation according to one embodiment of the present invention.

FIG. 3A is a simplified schematic plan view of a fluid dispensing apparatus in a first mode of operation according to one embodiment of the present invention. The fluid dispensing apparatus is a coater/developer module in a specific embodiment of the present invention. As illustrated in FIG. 3A, the dispense arm assembly 118, sometimes referred to as a nozzle arm assembly, is positioned over the right processing chamber to dispense a processing fluid onto a substrate 210 retained on the spin chuck 130. The dispense arm assembly 118 may contain an arm 220 and nozzle holding mechanism 222. The dispense arm assembly 118 is attached to an actuator 224 that is adapted to transfer and position the dispense arm assembly 118 in any position along the guide mechanism 226. In one embodiment, a system controller (not shown) is adapted to move the dispense arm assembly 118 vertically to correctly position the nozzle 114 over the substrate 210 during processing and also enable the nozzle holding mechanism to pick-up and drop-off the nozzles 114 from the nozzle holder assemblies 116. As described above, dispense arm access shutter 123 is adapted to move vertically to close and isolate one processing chamber 111 during processing from the central fluid dispense bank 112 along with the other process module 110 to prevent cross contamination of the substrates during processing.

Figure 3B:
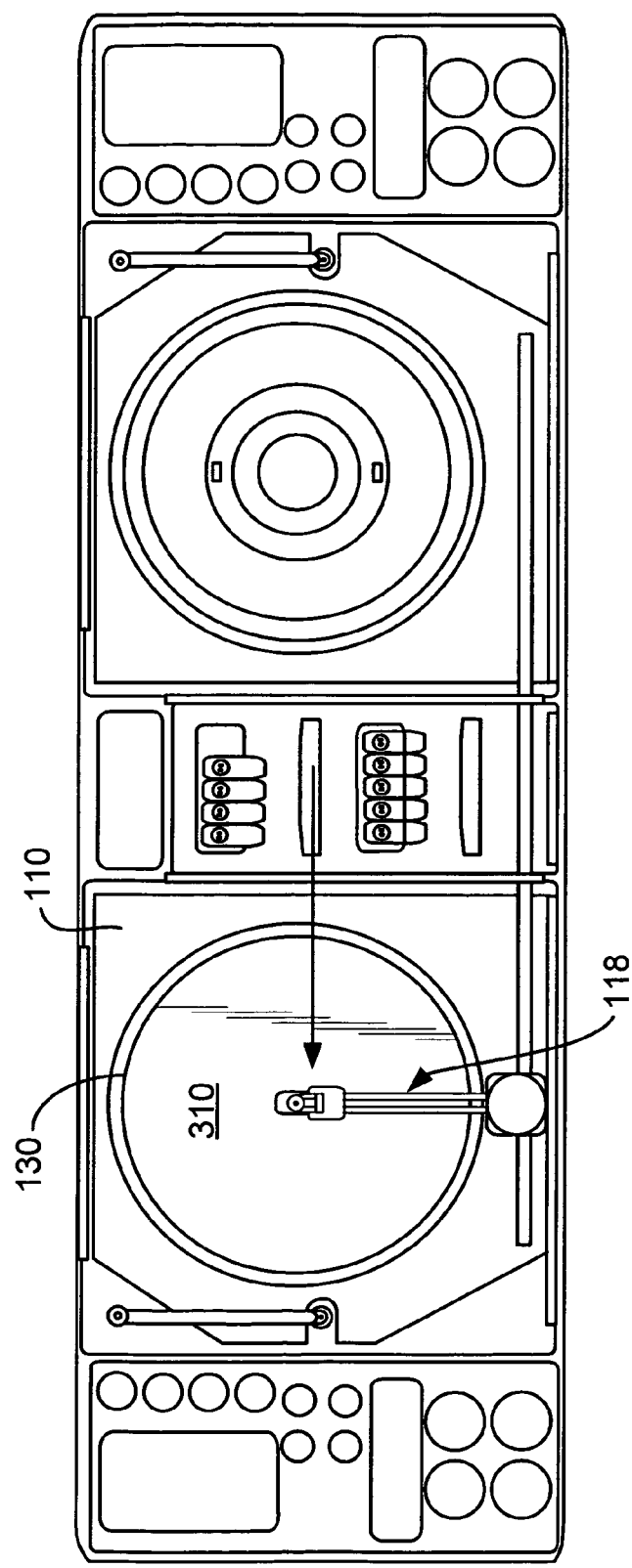
FIG. 3B is a simplified schematic plan view of a fluid dispensing apparatus in a second mode of operation according to another embodiment of the present invention.

FIG. 3B is a simplified schematic plan view of a fluid dispensing apparatus in a second mode of operation according to another embodiment of the present invention. As illustrated in FIG. 3B, the dispense arm assembly 118 is positioned over the left processing chamber 110 to dispense a processing fluid on a substrate 310 retained on the spin chuck 130. Dispense arm access shutter 122 is adapted to move vertically to close and isolate processing chamber 110 from the central fluid dispense bank 112 along with the other processing chamber 111 during processing to prevent cross contamination of the substrates during processing.

Figure 6:
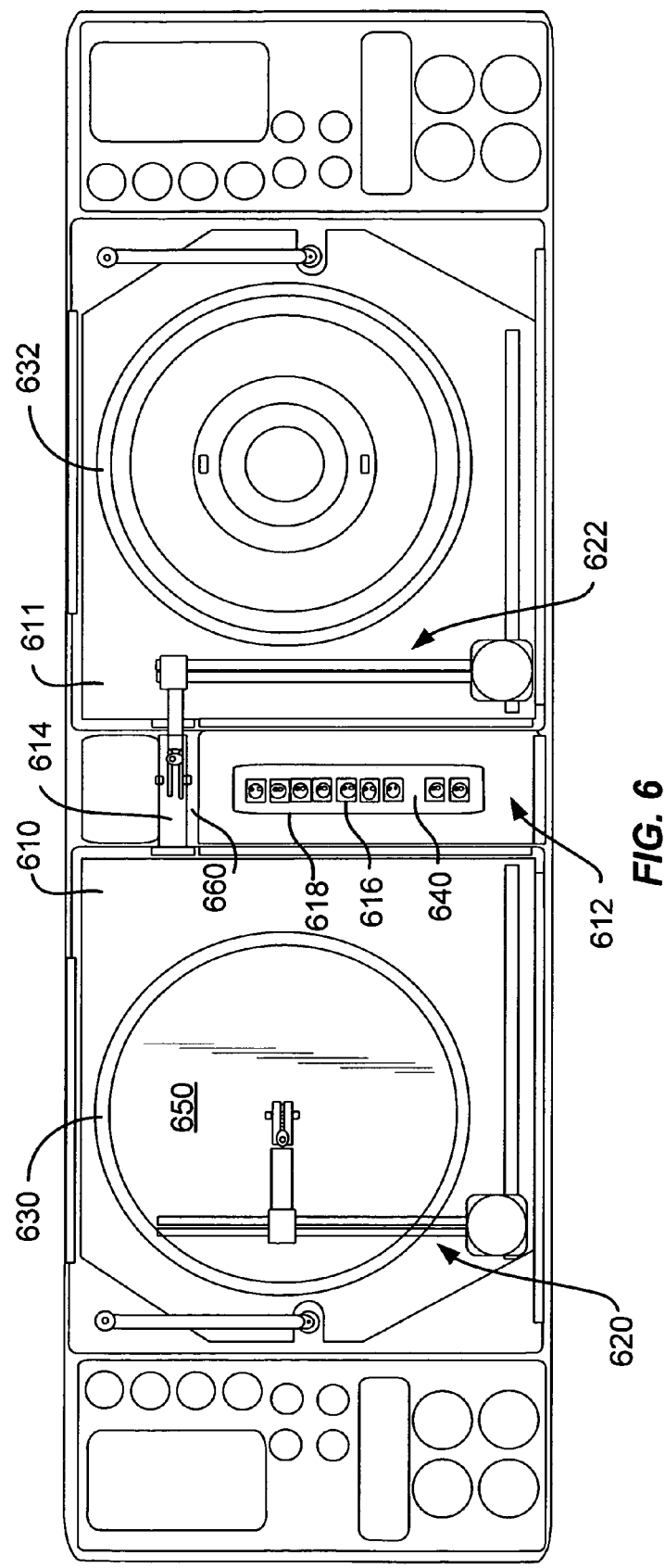
FIG. 6 is a simplified schematic plan view of a fluid dispensing apparatus according to another embodiment of the present invention.

FIG. 6 is a simplified schematic plan view of a fluid dispensing apparatus according to another embodiment of the present invention. As illustrated in FIG. 6, the fluid dispensing apparatus shares some commonalities with the apparatus illustrated in FIG. 2. For example, the apparatus illustrated in FIG. 6 includes a central fluid dispense bank 612 comprising a number of dispense nozzles, a home region 614 and two processing chambers positioned on opposite sides of the central fluid dispense bank and home region. As illustrated in FIG. 6, the central fluid dispense bank contains a single nozzle holder assembly 616 with the long dimension of the nozzle holder assembly substantially perpendicular to a line connecting the center of processing chamber 610 and the center of processing chamber 611.

The assembly illustrated in FIG. 6 also contains two nozzle arm assemblies 620 and 622 which are adapted to access, select, and detachably couple a dispense nozzle 618 from the nozzle holder assembly contained in the shared central fluid dispense bank. Each dispense arm assembly is actuated by motors (not shown) to translate the selected dispense nozzle to a desired position over the surface of the associated substrate. For example, dispense arm assembly 620 is associated with spin chuck 630 and dispense arm assembly 622 is associated with spin chuck 632. As illustrated in FIG. 6, dispense arm assembly 622 is located at the home region and is not coupled to a dispense nozzle. On the other hand, dispense arm assembly 620 is coupled to a dispense nozzle, which was initially positioned at location 640 in the nozzle holder assembly. Additionally, dispense arm assembly 620 has been moved to a position from which a coating fluid dispensed from the dispense nozzle will impinge on the center of substrate 650.

The dispense arm access shutters have been subdivided in the embodiment illustrated in FIG. 6 to provide separate access for the dispense arm assemblies with respect to the home position and the central fluid dispense bank. Additional moveable or permanent partitions are included in additional embodiments as will be evident to one of skill in the art. Merely by way of example, a permanent partition 660 located between the central fluid dispense bank 612 and the home position 614 will provide for environmental isolation between the central fluid dispense bank and the home region. In the embodiment illustrated in FIG. 6, each of the dispense nozzles may be plumbed to provide a different fluid solution. Alternatively, multiple nozzles may share the same pump and dispense the same fluid, for example a particular resist. Accordingly, the fluid dispensing apparatus illustrated in FIG. 6 is capable of performing a wide variety of coat and develop processes.

Figure 4A:
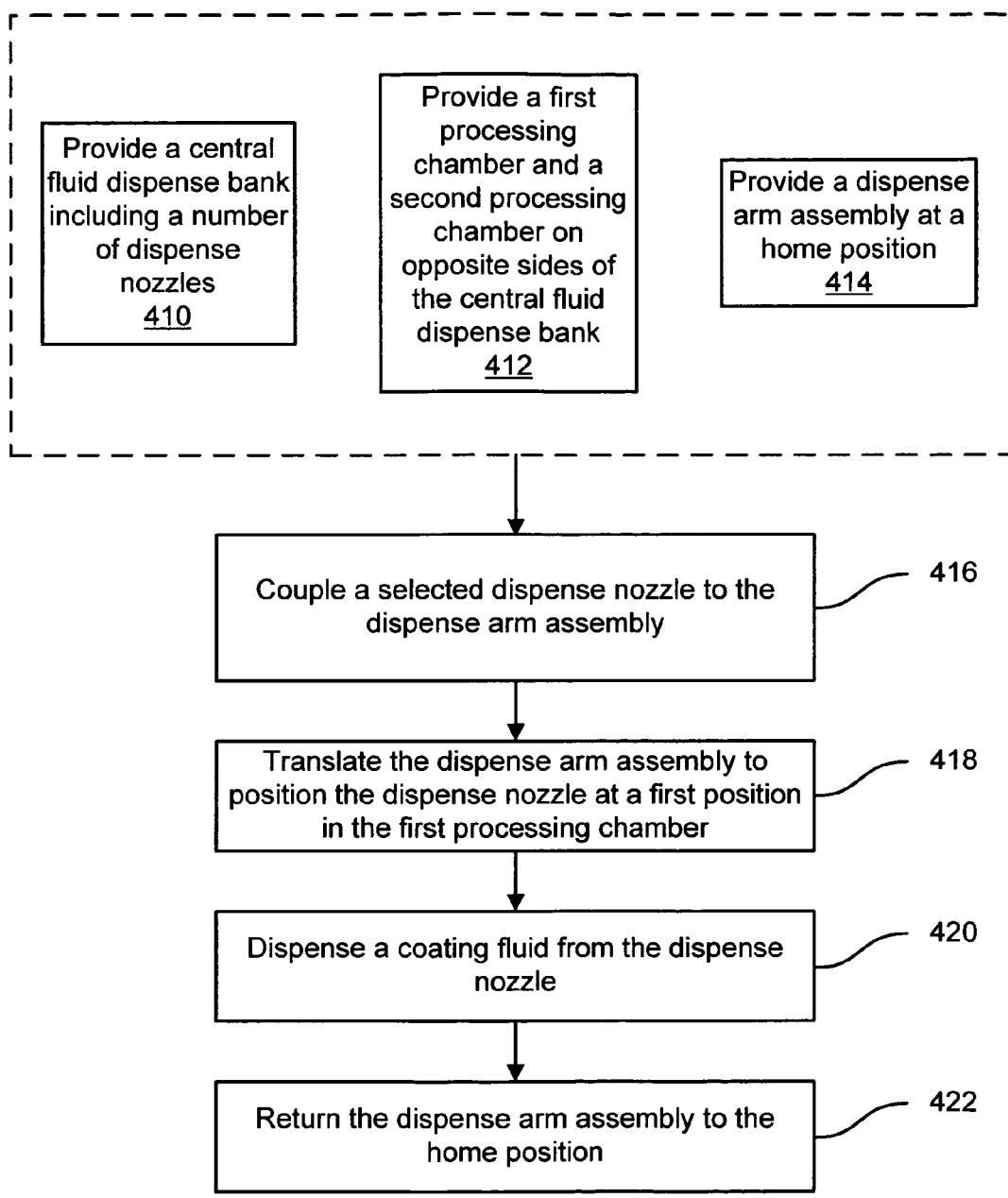
FIG. 4A is a simplified flowchart illustrating a method of operating a fluid dispense apparatus according to one embodiment of the present invention.

FIG. 4A is a simplified flowchart illustrating a method of operating a fluid dispense apparatus according to one embodiment of the present invention. The method includes providing a central fluid dispense bank comprising a number of dispense nozzles in step 410. In a particular embodiment, the central fluid dispense bank contains 16 nozzles providing 16 different resists. In an alternative embodiment, 16 nozzles are provided, but a single resist is provided by each nozzle, with the concentration of solvent varying with each nozzle. In other embodiments, the central fluid dispense bank contains a lesser or greater number of nozzles, depending on the particular application. The method also includes (step 412) providing a first processing chamber positioned on a first side of the central fluid dispense bank and a second processing chamber positioned on a second side of the central fluid dispense bank, wherein the first side is opposite the second side. The method further includes providing a dispense arm assembly located at a home position in step 414. In embodiments of the present invention, the home position is in the central fluid dispense bank region and the dispense arm assembly is adapted to translate between the central fluid dispense bank and the first and second processing chambers. The home position is not limited to a particular location inside the central fluid dispense bank region, but is understood to be a general location in the vicinity of the dispense nozzles.

In step 416, a dispense nozzle is selected from the dispense nozzles located in the central fluid dispense bank and the selected nozzle is coupled to the dispense arm assembly. In embodiments of the present invention, the step of selecting a first dispense nozzle includes detachably coupling the nozzle to the dispense arm using a gripper assembly integrated into an extension arm of the dispense arm assembly. As described previously, the dispense arm assembly is adapted to move in three dimensions, enabling the dispense arm assembly to lift the selected nozzle out of the nozzle holder assemblies and move the nozzle to either of the processing chambers. Translation in the vertical direction is utilized in one embodiment to remove the selected nozzle from the nozzle holder assembly and to position the nozzle a predetermined distance from the substrate surface prior to a fluid dispense step. One of ordinary skill in the art would recognize many variations, modifications, and alternatives. In step 418, the dispense arm assembly is translated by actuation of motors coupled to the dispense arm assembly. The dispense arm assembly is moved to position the dispense nozzle at a first position in the first processing chamber.

In some embodiments, the method includes positioning the nozzle at a first dispense position located over the center region of the substrate mounted on spin chuck 130, but this is not required by the present invention. Alternative embodiments utilize other positions within processing chamber 110.

The spin chuck is rotated to bring the substrate rotational speed to a predetermined value. In an embodiment, the spin chuck accelerates the substrate with an acceleration rate of up to about 50,000 RPMs/s to bring the substrate from a stationary position to a rotation rate of about 5,000 RPMs. Alternatively, the acceleration rate ranges from about 10 RPMs/s to about 50,000 RPMs/s and the rotation rate ranges from about one RPM to about 5,000 RPMs. Of course, the acceleration rate and the rotation rate will depend upon the particular applications.

In embodiments in which a solvent pre-wet is utilized, the first position is selected to position the solvent pre-wet nozzle present on the dispense arm assembly at a dispense position. In a specific embodiment, the dispense position is one in which the solvent pre-wet nozzle is positioned over the center of the substrate. After the solvent pre-wet nozzle is positioned, solvent is dispensed onto the spinning substrate. Subsequently, the dispense arm assembly is actuated to move the dispense arm assembly and position the dispense nozzle over the center of the substrate prior to dispensing fluid from the dispense nozzle.

A coating fluid is dispensed from the selected dispense nozzle, generally on a center portion of the substrate mounted on spin chuck 130 in step 420. The spin chuck is rotated during the dispense operation to spread the coating fluid over the surface of the substrate. The rotation speed may be variable or constant as a function of time. One of ordinary skill in the art would recognize many variations, modifications, and alternatives. The dispense arm is returned to the home position in step 422 and selected dispense nozzle is returned to the central fluid dispense bank.

Figure 4B:
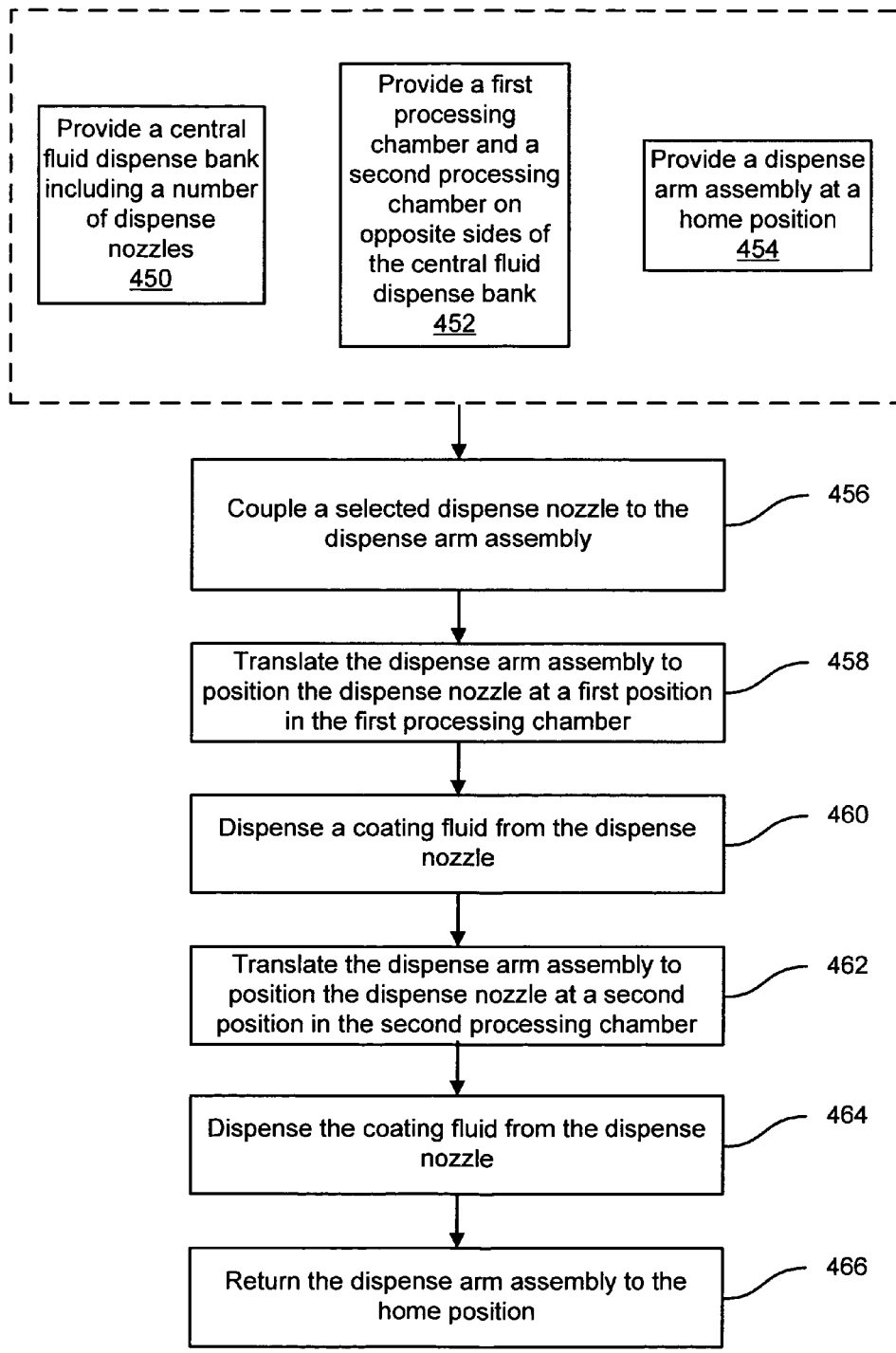
FIG. 4B is a simplified flowchart illustrating a method of operating a fluid dispense apparatus according to another embodiment of the present invention.

FIG. 4B is a simplified flowchart illustrating a method of operating a fluid dispense apparatus according to another embodiment of the present invention. Steps 450 through 460 in FIG. 4B parallel steps 410 through 420 in FIG. 4A. In the alternative embodiment illustrated in FIG. 4B, rather than returning the dispense arm assembly to the central fluid dispense bank and returning the selected dispense nozzle to the central fluid dispense bank, the dispense arm assembly is translated to a second position located over the center region of a second substrate mounted on spin chuck 131 in step 462. In embodiments in which a solvent pre-wet is utilized, the second position is selected to allow for dispensing of a solvent onto the center of the second substrate prior to adjustment of the dispense nozzle position and dispensing of the coating fluid from the dispense nozzle.

In a manner similar to the first dispense operation, the spin chuck 131 is rotated to bring the substrate rotational speed to a predetermined value. Depending on the application, the dispense parameters may be the same or different from those employed during the first dispense step. The optional solvent pre-wet and the coating fluid are dispensed from the selected dispense nozzle in step 464, generally on a center portion of the substrate mounted on spin chuck 131. The spin chuck is rotated during the dispense operation to spread the coating fluid over the surface of the substrate. The rotation speed may be variable or constant as a function of time. One of ordinary skill in the art would recognize many variations, modifications, and alternatives. After the second dispense step, the dispense arm assembly is returned to the home position over the central fluid dispense bank in step 466 and the selected dispense nozzle is returned to the central fluid dispense bank.

Although the previous example utilizes a single selected dispense nozzle for the first and second dispense steps, this is not required by the present invention. In other embodiments, steps are inserted between steps 460 and 462 so that a first dispense nozzle is selected for the first dispense step and a second dispense nozzle is selected for the second dispense step. Furthermore, in yet other alternative embodiments, the method of dispensing fluid onto substrates is not stopped after the second dispense step, but continued for more than two dispense steps. The dispense steps may alternate between processing chambers or may feature multiple sequential dispense steps in one processing chamber with the same or a different coating fluid. The variations possible with multiple dispense nozzles, multiple processing chambers and a home position for the dispense arm assembly in the central fluid dispense bank region will be apparent to one of skill in the art.

Substrates can be loaded into the two processing chambers using any appropriate robot. For example, in one embodiment, a central robot is adapted to transfer substrates into and out of both processing chambers in an alternating manner in one embodiment of the present invention. In some embodiments, the dispense arm assembly is positioned at a home position in the central fluid dispense bank region while the substrates are loaded by the central robot into the processing chambers. During the robot loading and unloading process, the dispense arm access doors are generally kept closed to limit movement of air and air-borne particles between the processing chambers and the central fluid dispense bank region.

The above sequence of steps provides a method for dispensing a fluid onto a semiconductor substrate according to an embodiment of the present invention. As shown, the method uses a combination of steps including a way of utilizing a central fluid dispense bank shared by two processing chambers according to an embodiment of the present invention. Other alternatives can also be provided where steps are added, one or more steps are removed, or one or more steps are provided in a different sequence without departing from the scope of the claims herein. Further details of the present method can be found throughout the present specification.

Figure 5:
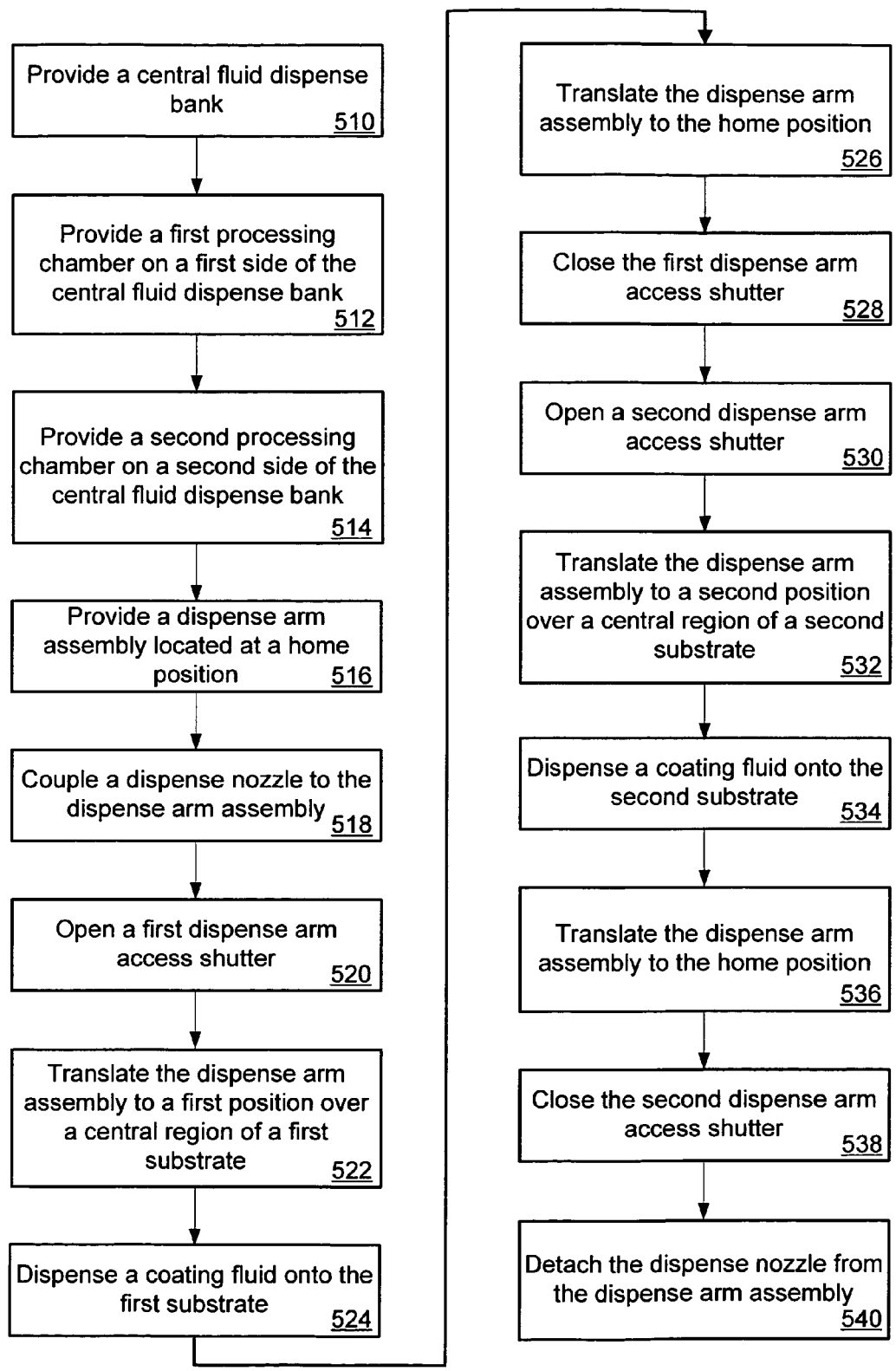
FIG. 5 is a simplified flowchart illustrating a method of operating a fluid dispense apparatus according to yet another embodiment of the present invention.

FIG. 5 is a simplified flowchart illustrating a method of operating a fluid dispense apparatus according to yet another embodiment of the present invention. The method includes providing a central fluid dispense bank in step 510. The central fluid dispense bank comprises a number of dispense nozzles. In a particular embodiment, the central fluid dispense bank contains 16 nozzles providing 16 different resists. In an alternative embodiment, 16 nozzles are provided, but a single resist is provided by each nozzle, with the concentration of solvent varying with each nozzle. In other embodiments, the central fluid dispense bank contains a lesser or greater number of nozzles, depending on the particular application. The method also includes providing a first processing chamber positioned on a first side of the central fluid dispense bank (step 512) and a second processing chamber positioned on a second side of the central fluid dispense bank (step 514). In a specific embodiment, the first processing chamber and the second processing chamber are positioned on opposite sides of the central fluid dispense bank.

The method further includes providing a dispense arm assembly at a home position (step 516) that is adapted to translate between the central fluid dispense bank and the first and second processing chambers and selecting a dispense nozzle from the plurality of dispense nozzles. In embodiments of the present invention, the step of selecting the dispense nozzle includes detachably coupling the nozzle to the dispense arm assembly using a gripper assembly integrated into an extension arm of the dispense arm assembly (step 518). Moreover, in some embodiments, the gripper assembly is translated in the vertical and lateral directions after coupling the nozzle to the gripper assembly. Translation in the vertical direction is utilized in one embodiment to separate tubing coupled to the selected dispense nozzle from tubing coupled to other dispense nozzles in the nozzle holder assembly, reducing particle counts. One of ordinary skill in the art would recognize many variations, modifications, and alternatives.

In one particular embodiment, the first processing chamber and the second processing chamber are controlled to provide separate temperature and humidity environments for each of the processing chambers. Thus, in one embodiment, dispense arm access shutters are provided between the central fluid dispense bank and both of the processing chambers, thereby providing environmental control for the processing chambers. In step 520, a first dispense arm access shutter located between the central fluid dispense bank and the first processing chamber is opened. The opening of the first dispense arm access shutter provides a path for the dispense arm assembly to move the selected nozzle from the central fluid dispense bank to a first position in the first processing chamber (step 522). Generally, the first dispense position is a position at which the dispense nozzle is located over the center region of the substrate mounted on spin chuck 130, but this is not required by the present invention. Alternative embodiments utilize other positions within processing chamber 110, for example, a position in which the solvent pre-wet nozzle is positioned over the center of the substrate.

The spin chuck is rotated to bring the substrate rotational speed to a predetermined value. In an embodiment, the spin chuck accelerates the substrate with an acceleration rate of up to about 50,000 RPMs/s to bring the substrate from a stationary position to a rotation rate of about 5,000 RPMs. Alternatively, the acceleration rate ranges from about 10 RPMs/s to about 50,000 RPMs/s and the rotation rate ranges from about one RPM to about 5,000 RPMs. Of course, the acceleration rate and the rotation rate will depend upon the particular applications.

A coating fluid is dispensed from the dispense nozzle in step 524, generally on a center portion of the substrate mounted on spin chuck 130. The spin chuck is rotated during the dispense operation to spread the coating fluid over the surface of the substrate. The rotation speed may be variable or constant as a function of time. One of ordinary skill in the art would recognize many variations, modifications, and alternatives. In step 526, the dispense arm assembly is translated to the home position. In a particular embodiment, the time period during which the substrate is rotated after fluid dispense is less than the translation time for the dispense arm assembly to move from the dispense position to the central fluid dispense bank region. Thus, in this particular embodiment, the dispense arm assembly exits the first processing chamber after the dispense step and the first dispense arm access shutter is closed prior to the completion of the spin step.

In step 530, a second dispense arm access shutter located between the central fluid dispense bank and the second processing chamber is opened. The opening of the second dispense arm access shutter provides a path for the dispense arm assembly to move the selected nozzle from the central fluid dispense bank to a second position in the second processing chamber (step 532). Generally, the second dispense position is a position at which the dispense nozzle is located over the center region of the substrate mounted on spin chuck 131, but this is not required by the present invention. Alternative embodiments utilize other positions within processing chamber 111, for example, a position in which the solvent pre-wet nozzle is positioned over the center of the substrate. As discussed in relation to processing chamber 110, the spin chuck 131 is rotated to bring the substrate rotational speed to a predetermined value.

A coating fluid is dispensed from the dispense nozzle in step 534, generally on a center portion of the substrate mounted on spin chuck 131. The spin chuck is rotated during the dispense operation to spread the coating fluid over the surface of the substrate. The rotation speed may be variable or constant as a function of time. One of ordinary skill in the art would recognize many variations, modifications, and alternatives. In step 536, the dispense arm assembly is translated to the home position. In a particular embodiment, the time period during which the substrate is rotated after fluid dispense is less than the translation time for the dispense arm assembly to move from the dispense position to the central fluid dispense bank region. Thus, in this particular embodiment, the dispense arm assembly exits the second processing chamber after the dispense step and the second dispense arm access shutter is closed (step 538) prior to the completion of the spin step. In some embodiments, the selected dispense nozzle is detached from the dispense arm assembly in step 540.

The above sequence of steps provides a method for dispensing a fluid onto a number of semiconductor substrates according to an embodiment of the present invention. As shown, the method uses a combination of steps including a way of utilizing a central fluid dispense bank shared by two environmentally controlled processing chambers according to an embodiment of the present invention. Other alternatives can also be provided where steps are added, one or more steps are removed, or one or more steps are provided in a different sequence without departing from the scope of the claims herein. Further details of the present method can be found throughout the present specification.

In an alternative embodiment, the dispense arm access shutter is opened, partially closed, and reopened during each coating process. In this particular embodiment, the dispense arm access shutter is partially closed after the dispense arm enters the processing chamber and the dispense arm is moved to the side of the processing chamber adjacent the central fluid dispense bank after the fluid is dispensed. In this embodiment, the dispense arm access shutter remains partially closed during the coating process while the dispense arm waits at the side of the processing chamber for the coating process to be completed. After completion of the coating process, the dispense arm access shutter is opened, the dispense arm returns to the central fluid dispense bank region, where the first dispense nozzle is returned to the central fluid dispense bank, and the dispense arm access shutter is closed once again. In this particular embodiment, the time during which the dispense arm access shutter is open and the processing chamber is exposed to the environment of the central fluid dispense bank region is minimized, reducing cross contamination from either the central fluid dispense bank or the other processing chamber.

Although the previous example utilizes a single selected dispense nozzle for the first and second dispense steps, this is not required by the present invention. In other embodiments, steps are inserted between steps 528 and 530 so that a first dispense nozzle is selected for the first dispense step and a second dispense nozzle is selected for the second dispense step. Furthermore, in yet other alternative embodiments, the method of dispensing fluid onto substrates is not stopped after the second dispense step, but continued for more than two dispense steps. The dispense steps may alternate between processing chambers or may feature multiple sequential dispense steps in one processing chamber with the same or a different coating fluid. The variations possible with multiple dispense nozzles, multiple processing chambers and a home position for the dispense arm assembly in the central fluid dispense bank region will be apparent to one of skill in the art.

FIG. 8 is a simplified timing diagram illustrating operation of a fluid dispensing apparatus according to one embodiment of the present invention. This diagram is merely an example of a process flow, which should not limit the scope of the claims herein. Moreover, the diagrams presented in FIG. 8 are not drawn to scale, but merely represent a series of timed events in relation to each other. FIG. 8A illustrates the motion of the dispense arm assembly along the guide rail 119 as illustrated in FIG. 2. With reference to FIGS. 2 and 8B, the motion of the dispense arm assembly to the left (to service processing chamber 110) and to the right (to service processing chamber 111 is illustrated by plotting the velocity of the dispense arm assembly in the left and right directions as a function of time as a positive and negative velocity, respectively.

Figure 8A:
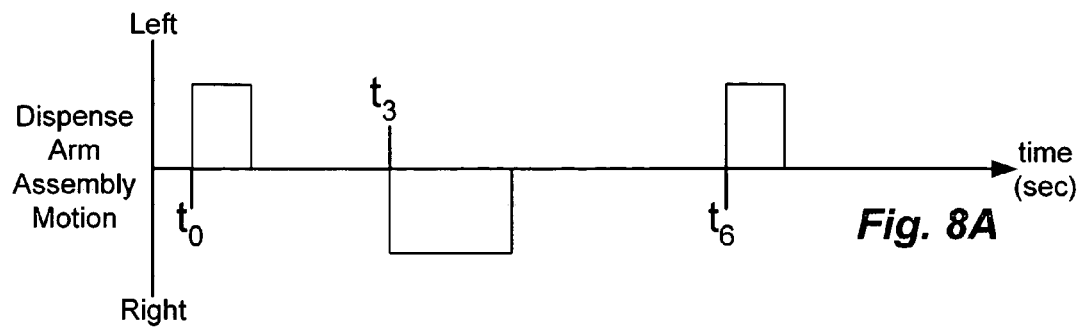
FIG. 8 is a simplified timing diagram illustrating operation of a fluid dispensing apparatus according to an embodiment of the present invention.

In the embodiment illustrate in FIG. 8A, at time $t_0$, the dispense arm assembly is translated from the home position to the left for a predetermined time period and stopped. Depending on the distance from the home position to the dispense location in processing chamber 110, the predetermined time period and the velocity of motion are related as will be evident to one of skill in the art. The motion of the dispense arm assembly and dispense nozzles in the vertical direction (with respect to FIG. 2) and the direction perpendicular to the guide rail in the plane of the figure are not illustrated in FIG. 8A for purposes of clarity, but one of skill in the art will appreciate that these motions are included as discussed previously.

Figure 8B:
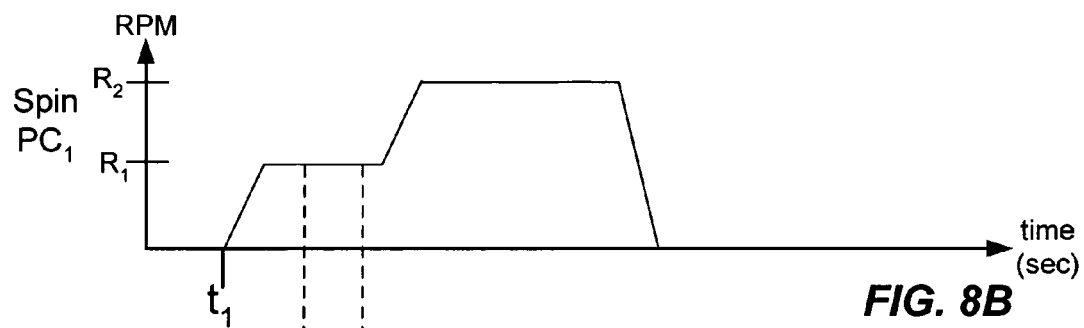

As illustrated in FIG. 8B, the spin rate of the spin chuck in processing chamber 110 ($PC_1$) is illustrated as a function of time. In an embodiment, the spinning of the chuck in processing chamber 110 is not initiated until the dispense arm assembly is located at a desired position and stopped. In other embodiments, the spin process is begun while the dispense arm assembly is still in a state of motion. Moreover, as discussed previously, the dispense arm assembly is moved in some embodiments, from a first position in which solvent for a pre-wet process is dispensed to a second position in which a resist or other fluid is dispensed. In the embodiment illustrated in FIG. 8B, the spin process for the spin chuck in processing chamber 110 is initiated at time $t_1$, before the motion of the dispense arm assembly has been stopped. The spin chuck is accelerated, maintained at a constant rotational velocity $R_1$ for a first predetermined time during the dispense process, and accelerated to a second, higher rotational velocity $R_2$ for a second predetermined time period. Of course, the rotational velocities and time periods will depend on the particular application.

Figure 8C:
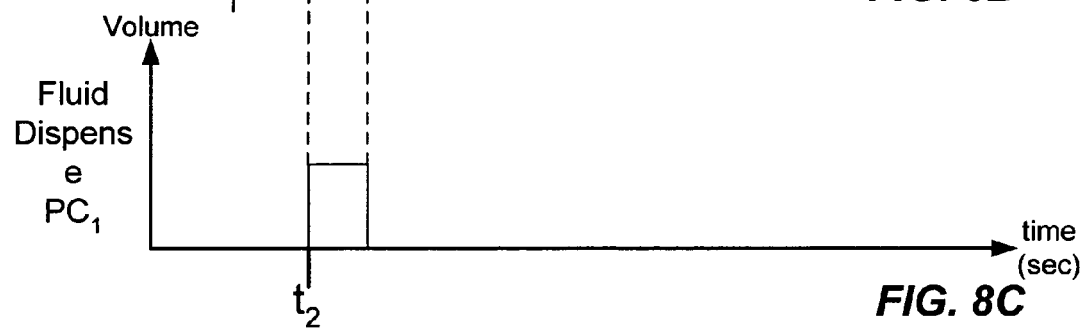

FIG. 8C illustrates the volume of fluid dispensed from the dispense nozzle as a function of time. Comparison of FIGS. 8A and 8C illustrate that the dispense arm assembly is positioned in processing chamber 110 ($PC_1$) during this dispense step. As illustrated in FIG. 8C, the fluid dispense step is performed while the spin chuck in processing chamber 110 is spinning at the first rate, $R_1$. For purposes of clarity, additional dispense steps, such as solvent pre-wet, have been omitted from this figure. Moreover, although the volume of fluid dispensed is illustrated as constant as a function of time during the fluid dispense step, one of skill in the art will appreciate that this is not required by the present invention. In alternative embodiments, the volume dispensed as a function of time follows other functional relationships, for example, increasing and/or decreasing the dispensed volume as a function of time as appropriate to a particular process.

Figure 8D:
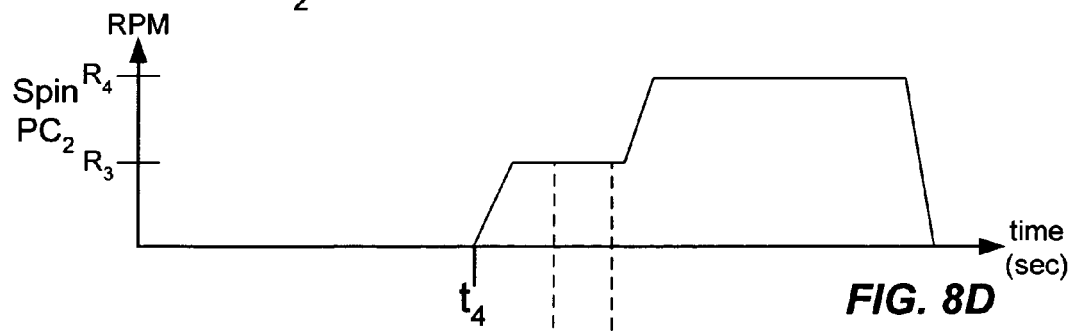
Figure 8E:
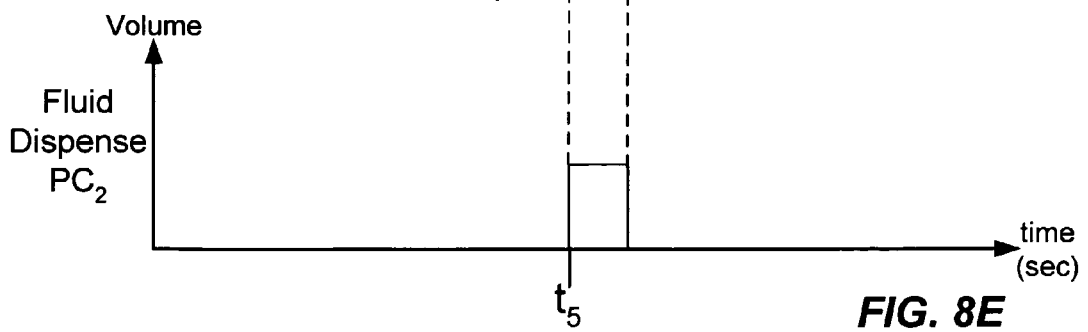

FIGS. 8D and 8E illustrated the spin rate of the spin chuck in processing chamber 111 ($PC_2$) and the volume of fluid dispensed from the dispense nozzle as functions of time. Referring to FIGS. 2 and 8A, at time $t_3$, the dispense arm assembly is translated from the left processing chamber 110 in the right direction, moving the dispense nozzle to a desired position in processing chamber 111. As illustrated in the figure, the time utilized to move the dispense arm assembly from processing chamber 110 to processing chamber 111 is greater than the time originally required to move the dispense arm assembly from the home position to processing chamber 111. In some embodiments, this increased time results from the motion of the dispense arm assembly at a generally equal speed, but traveling over a greater distance. Of course, in alternative embodiments, velocities, distances, and times, are related as will be evident to one of skill in the art. Moreover, the translation of the dispense arm assembly illustrated in FIG. 8A at time $t_3$ is shown as occurring at a constant velocity. In other embodiments, the motion of the dispense arm assembly is stopped at the home position, the dispense nozzle is changed as discussed above, and the motion continues in the left direction. One of ordinary skill in the art would recognize many variations, modifications, and alternatives.

The spin chuck in processing chamber 111 is spun up to first rotational velocity $R_3$ at time $t_4$ and the rotational velocity is further increased to velocity $R_4$ after the fluid is dispensed at time $t_5$. As illustrated in the figures, the spin processes in the two processing chambers are overlapped. Thus, in some embodiments of the present invention, the use of a shared dispense architecture results in improved system throughput, among other advantages. The dispense arm assembly is translated to the home position at time $t_6$.

The examples and embodiments described herein are for illustrative purposes only. Various modifications or changes in light thereof will be suggested to persons skilled in the art and are to be included, within the spirit and purview of this application and scope of the appended claims. It is not intended that the invention be limited, except as indicated by the appended claims.

What is claimed is:

1. An apparatus for dispensing fluid during semiconductor substrate processing operations, the apparatus comprising:
   a first processing chamber;
   a second processing chamber;
   a central fluid dispense bank positioned between the first processing chamber and the second processing chamber, wherein the central fluid dispense bank comprises a plurality of dispense nozzles coupled to a plurality of fluid sources;
   a dispense arm assembly;
   a first dispense arm access shutter positioned between the first processing chamber and the central fluid dispense bank and moveable between an open and a closed position; and
   a second dispense arm access shutter positioned between the central fluid dispense bank and the second processing chamber and moveable between an open and a closed position, wherein the dispense arm assembly can travel from the first processing chamber to the second processing chamber when the first and the second dispense arm access shutters are in the open position.

2. The apparatus of claim 1 wherein the plurality of fluid sources comprises fluids selected from the group consisting of organic, inorganic, hybrid, and aqueous.

3. The apparatus of claim 1 wherein the dispense arm assembly is configured to hold at least one nozzle selected from the plurality of dispense nozzles.

4. The apparatus of claim 3 wherein the dispense arm assembly comprises a plurality of sections, each section actuated by a motor, wherein the at least one nozzle is moveable in three dimensions.

5. The apparatus of claim 1 wherein the process performed in the first processing chamber and/or the second processing chamber is a process selected from the group consisting of photoresist, developer, BARC, TARC, shrink coat, spin-on materials, and poly-isoindolo-quinazolinedione.

6. The apparatus of claim 1 wherein the first processing chamber comprises a first spin chuck configured to hold and rotate a first substrate and the second processing chamber comprises a second spin chuck configured to hold and rotate a second substrate.

7. A controlled environment apparatus for dispensing fluid during semiconductor substrate processing operations, the controlled environment apparatus comprising:
a first processing chamber;
a second processing chamber;
a dispense arm assembly having a home position;
a first dispense arm access shutter positioned between the home position and the first processing chamber;
a second dispense arm access shutter positioned between the home position and the second processing chamber; and
a central fluid dispense bank positioned between the first dispense arm access shutter and the second dispense arm access shutter, wherein a first temperature in the first processing chamber and a second temperature in the second processing chamber are independently controlled.

8. The apparatus of claim 7 wherein a first set of supply ports provide temperature controlled air to the first processing chambers and a second set of supply ports independently provide temperature controlled air to the second processing chamber.

9. The apparatus of claim 7 wherein a first humidity in the first processing chamber and a second humidity in the second processing chamber are independently controlled.

10. The apparatus of claim 7 wherein the first processing chamber comprises a first exhaust system and the second processing chamber comprises a second exhaust system and the first and second exhaust systems are independently controlled.

11. The apparatus of claim 7 wherein the central fluid dispense bank comprising a plurality of dispense nozzles coupled to a plurality of fluid sources.

12. The apparatus of claim 7 wherein the first processing chamber and the second processing chamber are positioned on opposite sides of the central fluid dispense bank.

13. The apparatus of claim 7 wherein the first processing chamber comprises a first spin chuck adapted to hold and rotate a first substrate and the second processing chamber comprises a second spin chuck adapted to hold and rotate a second substrate.

* * * * *